(12) United States Patent
Huang

(10) Patent No.: US 9,029,904 B2
(45) Date of Patent: May 12, 2015

(54) HIGH ILLUMINATION EFFICIENCY LIGHT EMITTING DIODE

(71) Applicant: Lextar Electronics Corporation, Hsinchu (TW)

(72) Inventor: Kun-Fu Huang, Hsinchu County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/164,247

(22) Filed: Jan. 26, 2014

(65) Prior Publication Data

US 2015/0053915 A1 Feb. 26, 2015

(30) Foreign Application Priority Data

Aug. 20, 2013 (TW) .............................. 102129828 A

(51) Int. Cl.

| | |
|---|---|
| *H01L 33/00* | (2010.01) |
| *H01L 33/24* | (2010.01) |
| *H01L 33/06* | (2010.01) |
| *H01L 33/32* | (2010.01) |
| *H01L 33/60* | (2010.01) |
| *H01L 33/04* | (2010.01) |
| *H01L 33/38* | (2010.01) |
| *H01L 33/14* | (2010.01) |

(52) U.S. Cl.
CPC ................ *H01L 33/24* (2013.01); *H01L 33/06* (2013.01); *H01L 33/32* (2013.01); *H01L 33/60* (2013.01); *H01L 33/04* (2013.01); *H01L 33/387* (2013.01); *H01L 33/14* (2013.01); *H01L 33/382* (2013.01)

(58) Field of Classification Search
CPC ......... H01L 33/04; H01L 33/60; H01L 33/10; H01L 33/62; H01L 33/387; H01L 33/385; H01L 33/382; H01L 31/035236; H01L 33/08; H01L 33/14
USPC ............................... 257/9, 98, 99; 438/22, 42
See application file for complete search history.

(56) References Cited

U.S. PATENT DOCUMENTS

| | | | | |
|---|---|---|---|---|
| 6,335,545 | B1 * | 1/2002 | Toda et al. ....................... | 257/94 |
| 6,791,117 | B2 * | 9/2004 | Yoshitake et al. ............... | 257/94 |
| 6,992,318 | B2 * | 1/2006 | Lee et al. ........................ | 257/15 |
| 7,531,370 | B2 * | 5/2009 | Sasaki et al. .................... | 438/22 |

(Continued)

FOREIGN PATENT DOCUMENTS

TW 201228037 A1 7/2012

*Primary Examiner* — Kevin Parendo
*Assistant Examiner* — Ira S Heinzen
(74) *Attorney, Agent, or Firm* — CKC & Partners Co., Ltd.

(57) ABSTRACT

A light emitting diode includes a substrate, a first semiconductor layer, a luminous layer, a second semiconductor layer, a current diffusion layer, a third semiconductor layer, a first electrode, a second electrode, and an insulation layer. The first semiconductor layer is formed above the substrate. The luminous layer is formed on the first semiconductor layer, and exposes a portion of the first semiconductor layer. The second semiconductor layer is formed on the luminous layer. The current diffusion layer is formed on the second semiconductor layer. The third semiconductor layer is formed on the current diffusion layer. The first electrode is formed on the first semiconductor layer. The second electrode includes a base portion formed on the surface of the substrate, and plural comb structures extending upward vertically. Each tip of the comb structure is in the third semiconductor layer. The insulation layer exposes the tip of each comb structure.

8 Claims, 5 Drawing Sheets

(56) References Cited

U.S. PATENT DOCUMENTS

| | | | |
|---|---|---|---|
| 8,384,112 B2* | 2/2013 | Tsang | 257/98 |
| 8,410,515 B2* | 4/2013 | Schubert | 257/99 |
| 8,680,549 B2* | 3/2014 | Fujimoto et al. | 257/98 |
| 2002/0117681 A1* | 8/2002 | Weeks et al. | 257/106 |
| 2005/0087884 A1* | 4/2005 | Stokes et al. | 257/778 |
| 2005/0145864 A1* | 7/2005 | Sugiyama et al. | 257/95 |
| 2006/0202219 A1* | 9/2006 | Ohashi et al. | 257/98 |
| 2010/0171135 A1* | 7/2010 | Engl et al. | 257/98 |
| 2012/0018763 A1* | 1/2012 | Engl et al. | 257/99 |
| 2012/0032218 A1* | 2/2012 | Choi et al. | 257/98 |
| 2012/0168712 A1* | 7/2012 | Fang et al. | 257/9 |

* cited by examiner

HIGH ILLUMINATION EFFICIENCY LIGHT EMITTING DIODE

RELATED APPLICATIONS

This application claims priority to Taiwan Application Serial Number 102129828, filed Aug. 20, 2013, which is herein incorporated by reference.

BACKGROUND

1. Field of Invention

The present invention relates to light emitting diode.

2. Description of Related Art

A light emitting diode (LED) is a kind of luminous semiconductor device. The luminous layer generates photons to emit light by the recombination of holes and electrons in the semiconductor. Because LED has the advantages of small volume, long using life, and power saving, it is widely utilized in display and illumination devices.

However, owing to material and manufacturing process of LED, the current crowding effect may be happened in the LED easily. The current distribution of the LED may be non-uniform so that the illuminating efficiency of LED is decreased and the output of light may be non-uniform. Therefore, it is hard to generate a light with high quality.

SUMMARY

One aspect of this invention is to provide a light emitting diode. The light emitting diode includes a substrate, a first semiconductor layer, a luminous layer, a second semiconductor layer, a current diffusion layer, a third semiconductor layer, a first electrode, a second electrode, and an insulation layer. The first semiconductor layer is formed above the substrate. The luminous layer is formed on a portion of the first semiconductor layer, and exposes a portion of the surface of the first semiconductor layer. The second semiconductor layer is formed on the luminous layer. The current diffusion layer is formed on the second semiconductor layer. The third semiconductor layer is formed on the current diffusion layer. The first electrode is formed on the exposed surface of the first semiconductor layer. The second electrode includes a base portion formed on the surface of the substrate, and a plurality of comb structures extending upward vertically. Each of the comb structures penetrates the first semiconductor layer, the luminous layer, the second semiconductor layer, the current diffusion layer, and portion of the third semiconductor layer. Each tip of the comb structures is in the third semiconductor layer. The insulation layer covers the outer surface of the second electrode which contacts the first semiconductor layer, the luminous layer, the second semiconductor layer, the current diffusion layer, and the third semiconductor layer. The insulation layer exposes the tip of each of the comb structures so that the tips contact the third semiconductor layer.

In one or more embodiments, the resistance of the current diffusion layer is greater than the resistance of the third semiconductor layer and the resistance of the second semiconductor layer.

In one or more embodiments, the current diffusion layer is formed of a super-lattice stacked structure.

In one or more embodiments, the super-lattice stacked structure includes at least one aluminum gallium nitride layer and at least one gallium nitride layer. The aluminum gallium nitride layer and the gallium nitride layer are stacked to each other.

In one or more embodiments, the aluminum gallium nitride layer is doped with N-type impurities or P-type impurities.

In one or more embodiments, the current diffusion layer is a gallium nitride layer doped with N-type impurities or P-type impurities.

In one or more embodiments, the current diffusion layer further includes a plurality of through holes.

In one or more embodiments, the first semiconductor layer is a P-type semiconductor layer, and the second semiconductor layer and the third semiconductor layer are N-type semiconductor layers, or the first semiconductor layer is an N-type semiconductor layer, and the second semiconductor layer and the third semiconductor layer are P-type semiconductor layers.

In one or more embodiments, each of the comb structures is cylinder-shaped or cone-shaped.

In one or more embodiments, the cross-sectional area of the tip of the cone-shaped comb structures is smaller than the cross-sectional area of the cone-shaped comb structures where contacts the base portion.

DETAILED DESCRIPTION

Figure 1:
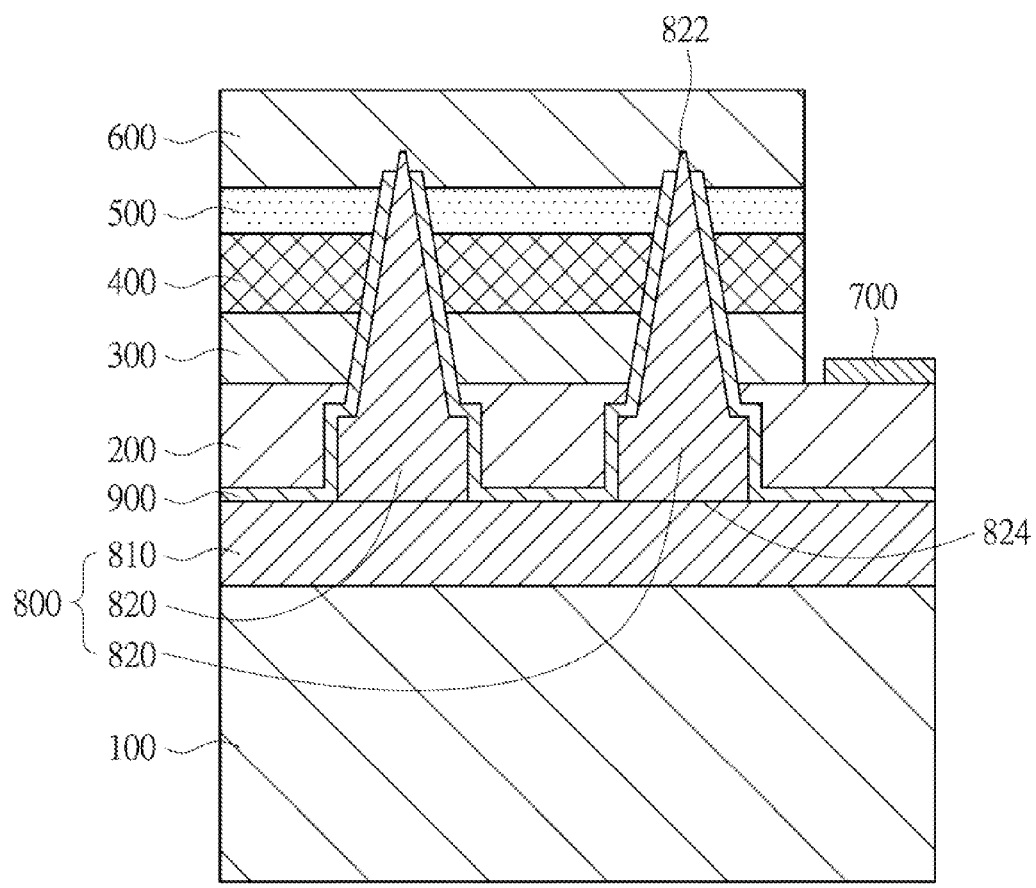
FIG. 1 is a cross-sectional view of a light emitting diode according to one embodiment of this invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a light emitting diode according to one embodiment of this invention. The light emitting diode includes a substrate 100, a first semiconductor layer 200, a luminous layer 300, a second semiconductor layer 400, a current diffusion layer 500, a third semiconductor layer 600, a first electrode 700, a second electrode 800, and an insulation layer 900. The first semiconductor layer 200 is formed above the substrate 100. The luminous layer 300 is formed on a portion of the first semiconductor layer 200, and exposes a portion of the surface of the first semiconductor layer 200. The second semiconductor layer 400 is formed on the luminous layer 300. The current diffusion layer 500 is formed on the second semiconductor layer 400. The third semiconductor layer 600 is formed on the current diffusion layer 500. The first electrode 700 is formed on the exposed surface of the first semiconductor layer 200. The second electrode 800 includes a base portion 810 formed on the surface of the substrate 100, and a plurality of comb structures 820 extending upward vertically. Each of the comb structures 820 penetrates the first semiconductor layer 200, the luminous layer 300, the second semiconductor layer 400, the current diffusion layer 500, and portion of the third semiconductor layer 600. Each tip 822 of the comb structures 820 is in the third semiconductor layer 600. The insulation layer 900 covers on the outer surface of the second electrode 800 which contacts the first semiconductor layer 200, the luminous layer 300, the second semiconductor layer 400, the current diffusion layer 500, and the third semiconductor layer 600. The insulation layer 900 exposes the tips 822 of each comb structure 820 so that the tips 822 contact the third semiconductor layer 600.

Accordingly, when a bias voltage is applied between the first electrode 700 and the second electrode 800, for example, positive voltage is applied to the second electrode 800, the current may flow from the base portion 810 of the second electrode 800 to the tip 822 of the comb structure 820. Then, the current may flow to the first electrode 700 through the third semiconductor layer 600, the current diffusion layer 500, the second semiconductor layer 400, the luminous layer 300, and the first semiconductor layer 200. The luminous layer 300 generates photons to emit light by the recombination of holes and electrons in the first semiconductor layer 200 and the second semiconductor layer 400. If the distance between two adjacent comb structures 820 is too far, the distribution of the current which flows from the comb structure 820 to the third semiconductor layer 600 may be not uniform so that the illumination efficiency of the luminous layer 300 is decreased. However, because the light emitting diode of this embodiment includes the current diffusion layer 500, when the current flows through the current diffusion layer 500, the current may diffuse in the current diffusion layer 500 properly and then flow downward. Therefore, the distribution area of the current in the second semiconductor layer 400, the luminous layer 300, and the first semiconductor layer 200 is increased so that the illumination efficiency of the luminous layer 300 is improved and the output light is uniform. Accordingly, the required quantity of the comb structure 820 may be decreased.

Figure 2:
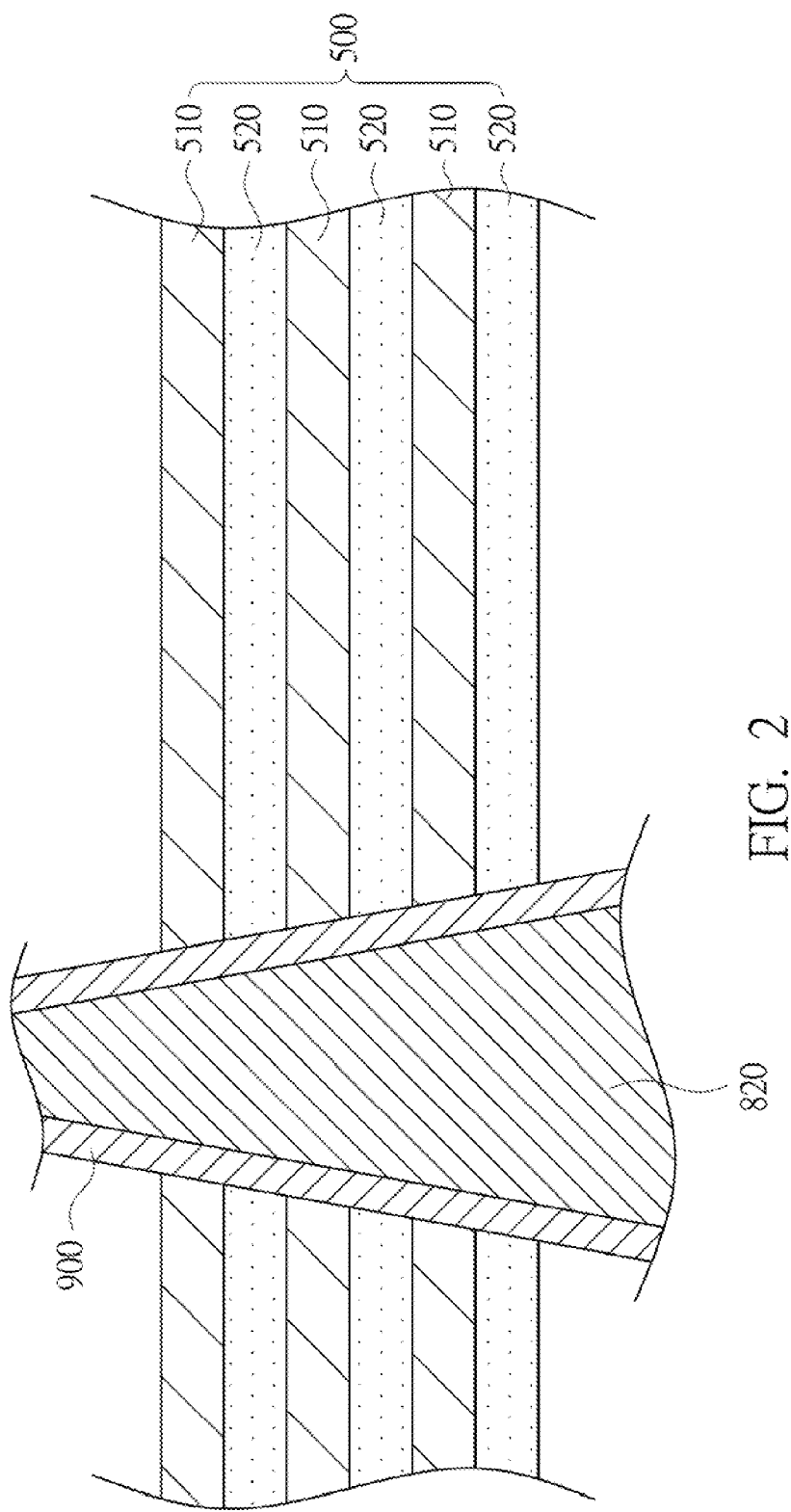
FIG. 2 is a partial enlarged view of the current diffusion layer and the comb structure in FIG. 1.

Reference is made to FIG. 2 which is a partial enlarged view of the current diffusion layer 500 and the comb structure 820 in FIG. 1. In one or more embodiments, the current diffusion layer is formed of a super-lattice stacked structure. The insulation layer 900 is disposed as the isolation between the super-lattice stacked structure and the comb structure 820. The interfaces between the stacking layers in the super-lattice stacked structure have high conductivity. In other words, the conductive resistance along the horizontal direction of the super-lattice stacked structure (defined as the direction vertical to the long axis of the comb structure 820) is smaller than that along the vertical direction (defined as the direction parallel to the long axis of the comb structure 820). Therefore, when the current flows to the interfaces, the current can be diffused and the distribution area of the current is increased.

For example, the super-lattice stacked structure may include at least one aluminum gallium nitride (AlGaN) layer 510 and at least one gallium nitride (GaN) layer 520. As shown in FIG. 2, the aluminum gallium nitride layers 510 and the gallium nitride layers 520 both have three layers respectively. However, this invention is not limited to three layers. The aluminum gallium nitride layers 510 and the gallium nitride layer 520 are stacked to each other. Accordingly, there is two-dimension electron gas with high conductivity between the aluminum gallium nitride layers 510 and the gallium nitride layer 520. The two-dimension electron gas advantages the flow of the current. Moreover, in one or more embodiments, the aluminum gallium nitride layer may be doped with N-type impurities or P-type impurities. However, the material of the super-lattice stacked structure above is merely a sample, and this invention is not limited to this material. One person having ordinary skills in the art may select any proper material of the super-lattice stacked structure as required.

Reference is made back to FIG. 1. In this embodiment, each of the comb structure 820 is cone-shaped. For example, as shown in FIG. 1, the cross-sectional area of the tip 822 of the comb structure 820 is smaller than that of the comb structure 820 where contacts the base portion 810. Therefore, when the insulation layer 900 is a reflecting material, the comb structure 820 with cone-shaped may help the light emitted from the luminous layer 300 to reflect to the output surface 600a by the insulation layer 900 so that the luminance flux of the light emitting diode is increased.

In one or more embodiment of this invention, the first semiconductor layer 200 is a P-type semiconductor layer, and the second semiconductor layer 400 and the third semiconductor layer 600 are N-type semiconductor layers. Otherwise, the first semiconductor layer 200 is an N-type semiconductor layer, and the second semiconductor layer 400 and the third semiconductor layer 600 are P-type semiconductor layers. However, the material of the second semiconductor layer 400 and the third semiconductor layer 600 may be the same or different.

Reference is made back to FIG. 1. In other embodiment, the current diffusion layer 500 may be not a super-lattice laminated structure, and the resistance of the current diffusion layer 500 can be greater than that of the third semiconductor layer 600 and that of the second semiconductor layer 400. Accordingly, when the current flows from the third semiconductor layer 600 to the current diffusion layer 500, the current diffusion layer 500 with high resistance may impede the current to flow downward, and make the current further diffuse in the current diffusion layer 500 so that the distribution area of the current is increased. When the current flows from the current diffusion layer 500 to the luminous layer 300 through the second semiconductor layer 400, because the distribution area of the current is increased, the illumination efficiency of the luminous layer 300 can be improved, the output light is uniform, and the required quantity of the comb structure 820 may be decreased.

In one or more embodiments, the current diffusion layer 500 may be the gallium nitride layer which is doped with N-type impurities or P-type impurities so that the current diffusion layer 500 possesses higher resistance as required. However, this invention is not limited to this material. Any material of the current diffusion layer 500 which makes the resistance thereof greater than that of the third semiconductor layer 600 and that of the second semiconductor layer 400 will fall into the scope of this invention.

Figure 3:
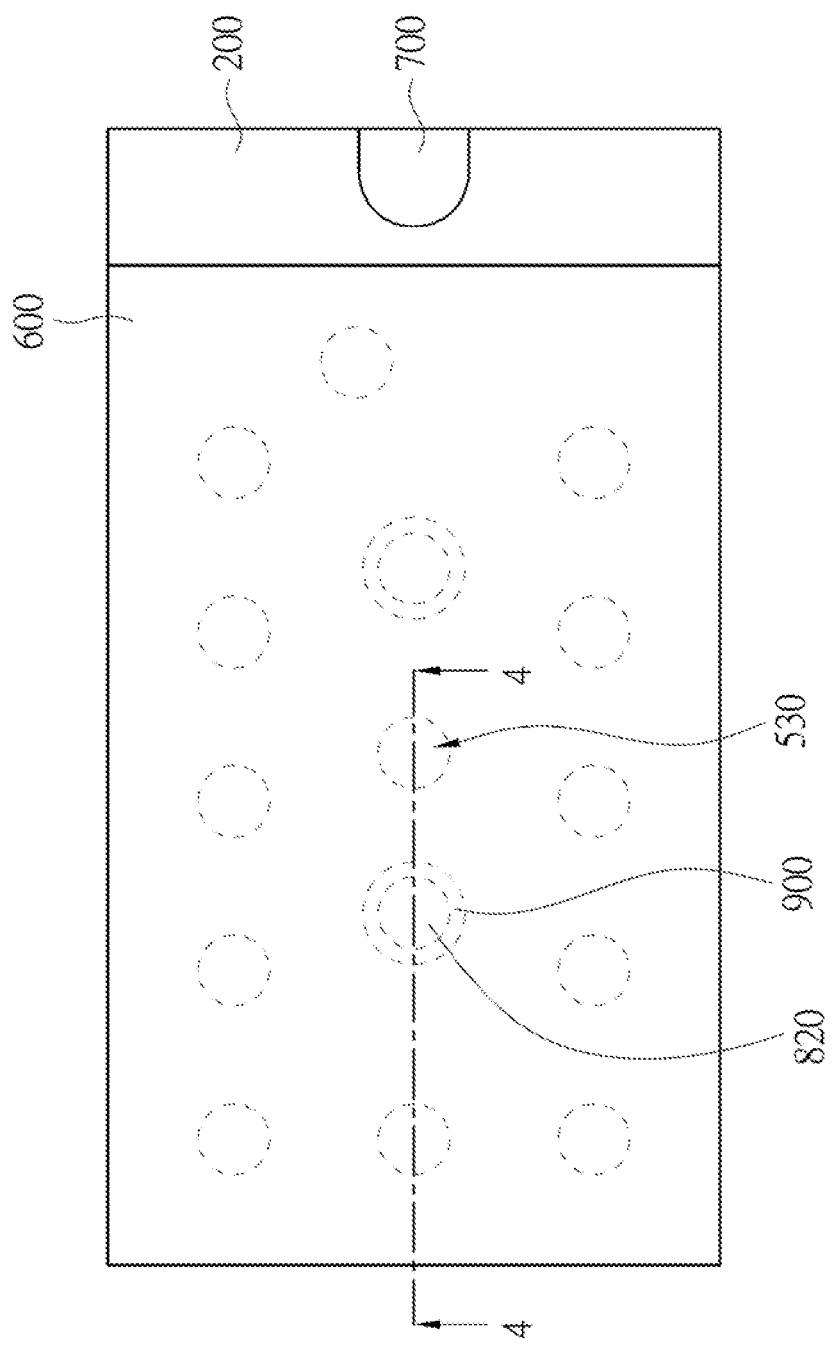
FIG. 3 is a top view of a light emitting diode according to another embodiment of this invention.
Figure 4:
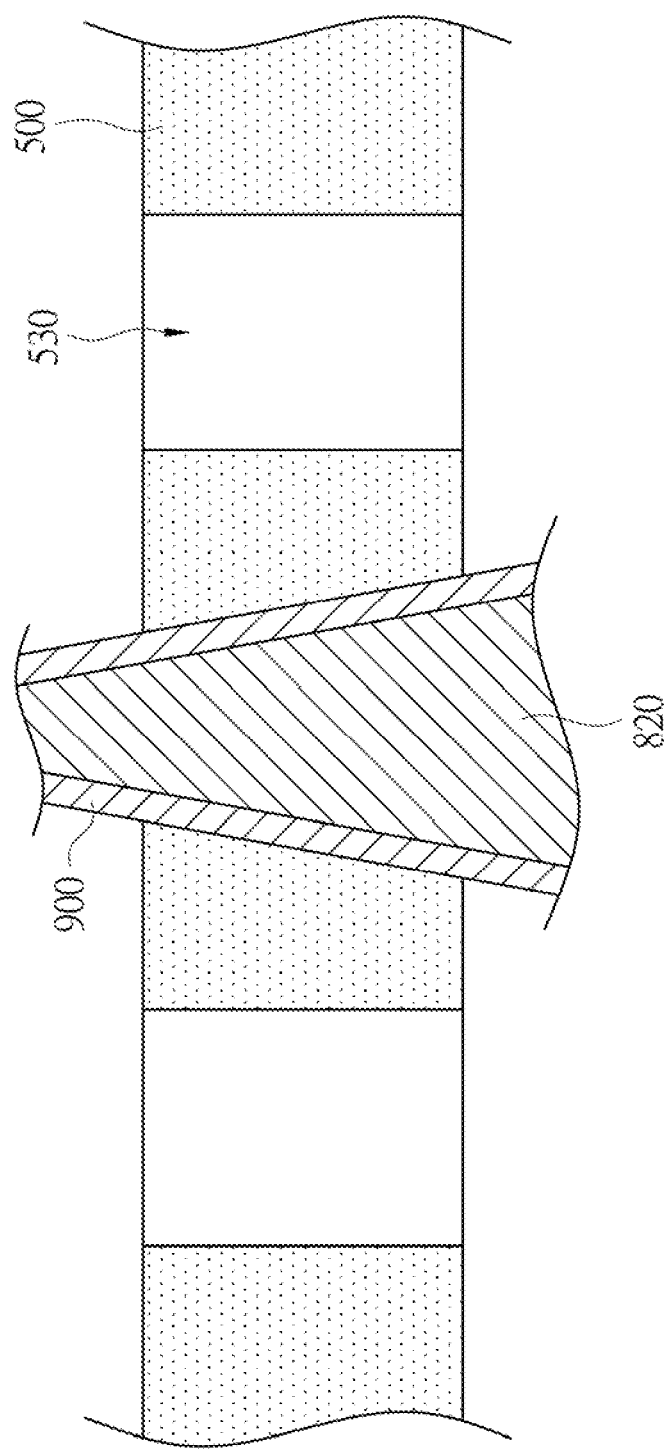
FIG. 4 is a cross-sectional view along line 4-4 in FIG. 3.

FIG. 3 is a top view of a light emitting diode according to another embodiment of this invention, and FIG. 4 is a cross-sectional view along line 4-4 in FIG. 3. Reference is made to FIG. 3 and FIG. 4. The difference between this embodiment and the embodiment of FIG. 1 is through holes 530. In this embodiment, the current diffusion layer 500 further includes a plurality of the through holes 530. These through holes 530 may be selectively filled with the material of the second semiconductor layer 400 or that of the third semiconductor layer 600. Thus, portion of the current from the third semiconductor layer 600 may flow to the second semiconductor layer 400 via the through holes 530. In greater detail, the current diffusion layer 500 may enhance the diffusion ability of the current in horizontal direction. Because the current may flow from the third semiconductor layer 600 to the second semiconductor layer 400 via the through holes 530 directly, the through holes 530 increase the current quantity in vertical direction. Accordingly, the quantity and the distribution density of the through holes 530 in the current diffusion layer 500 may control the direction of the current indirectly. The other parts of this embodiment are similar to the embodiment of FIG. 1, so those will not be described repeatedly herein.

Figure 5:
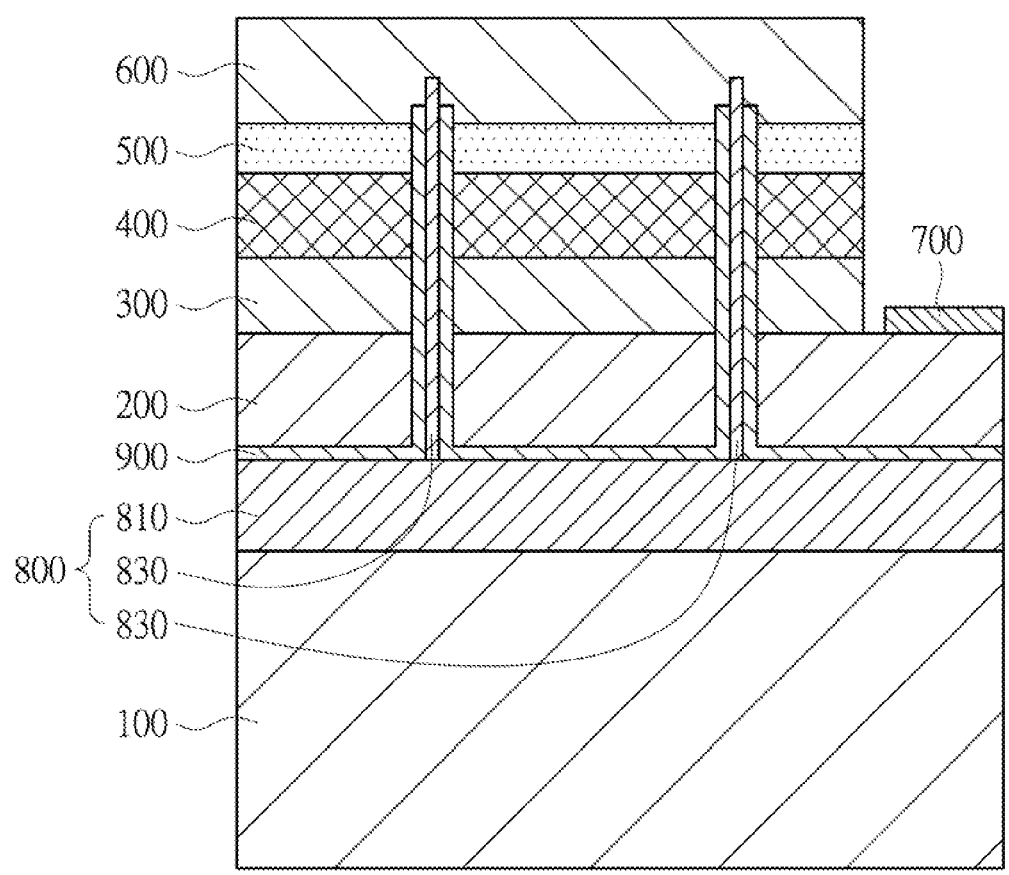
FIG. 5 is a cross-sectional view of a light emitting diode according to yet another embodiment of this invention.

Reference is made to FIG. 5 which is a cross-sectional view of a light emitting diode according to yet another embodiment of this invention. The difference between this embodiment and the embodiment of FIG. 1 is the shape of the comb structure. In this embodiment, the comb structure 830 may be of a cylinder shape. That is, the cross-sectional areas of the comb structure 830 in the first semiconductor layer 200, the luminous layer 300, the second semiconductor layer 400, and the current diffusion layer 500 are substantially the same. However, this invention is not limited to this shape. Any shape of the comb structure which makes the comb structures penetrates the first semiconductor layer 200, the luminous layer 300, the second semiconductor layer 400, the current diffusion layer 500, and portion of the third semiconductor layer 600 and makes the tip (as the tip 822 of the comb structure shown in FIG. 1) of the comb structures contact the third semiconductor layer 600 will fall into the scope of this invention. The other parts of this embodiment are similar to the embodiment of FIG. 1, so those will not be described repeatedly herein.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode, comprising:
   a substrate;
   a first semiconductor layer formed above the substrate;
   a luminous layer formed on a portion of the first semiconductor layer, wherein the luminous layer exposes a portion of the surface of the first semiconductor layer;
   a second semiconductor layer formed on the luminous layer;
   a current diffusion layer formed on the second semiconductor layer, wherein the current diffusion layer includes a plurality of through holes;
   a third semiconductor layer formed on the current diffusion layer, wherein a resistance of the current diffusion layer is greater than a resistance of the third semiconductor layer and a resistance of the second semiconductor layer;
   a first electrode formed on the exposed surface of the first semiconductor layer;
   a second electrode comprising a base portion formed on the surface of the substrate, and a plurality of comb structures extending upward vertically, wherein each of the comb structures penetrates the first semiconductor layer, the luminous layer, the second semiconductor layer, the current diffusion layer and portion of the third semiconductor layer, and each tip of the comb structures is in the third semiconductor layer; and
   an insulation layer covering the outer surface of the second electrode which contacts the first semiconductor layer, the luminous layer, the second semiconductor layer, the current diffusion layer, and the third semiconductor layer, wherein the insulation layer exposes the tip of each of the comb structures so that the tips contact the third semiconductor layer.

2. The light emitting diode of claim 1, wherein the current diffusion layer is formed of a super-lattice stacked structure.

3. The light emitting diode of claim 2, wherein the super-lattice stacked structure includes:
   at least one aluminum gallium nitride layer; and
   at least one gallium nitride layer, wherein the aluminum gallium nitride layer and the gallium nitride layer are stacked to each other.

4. The light emitting diode of claim 3, wherein the aluminum gallium nitride layer is doped with N-type impurities or P-type impurities.

5. The light emitting diode of claim 1, wherein the current diffusion layer is a gallium nitride layer doped with N-type impurities or P-type impurities.

6. The light emitting diode of claim 1, wherein the first semiconductor layer is a P-type semiconductor layer, and the second semiconductor layer and the third semiconductor layer are N-type semiconductor layers, or wherein the first semiconductor layer is an N-type semiconductor layer, and the second semiconductor layer and the third semiconductor layer are P-type semiconductor layers.

7. The light emitting diode of claim 1, wherein each of the comb structures is cylinder-shaped or cone-shaped.

8. The light emitting diode of claim 7, wherein a cross-sectional area of the tip of the cone-shaped comb structure is smaller than a cross-sectional area of the cone-shaped comb structures where contacts the base portion.

* * * * *